(12) United States Patent
Moriguchi et al.

(10) Patent No.: US 8,614,493 B2
(45) Date of Patent: Dec. 24, 2013

(54) PHOTOSENSOR ELEMENT, PHOTOSENSOR CIRCUIT, THIN FILM TRANSISTOR SUBSTRATE, DISPLAY PANEL, AND METHOD FOR MANUFACTURING PHOTOSENSOR ELEMENT

(75) Inventors: Masao Moriguchi, Osaka (JP); Yohsuke Kanzaki, Osaka (JP); Tsuyoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/518,564

(22) PCT Filed: Nov. 11, 2010

(86) PCT No.: PCT/JP2010/006633
§ 371 (c)(1),
(2), (4) Date: Jul. 19, 2012

(87) PCT Pub. No.: WO2011/077629
PCT Pub. Date: Jun. 30, 2011

(65) Prior Publication Data
US 2012/0273785 A1    Nov. 1, 2012

(30) Foreign Application Priority Data

Dec. 25, 2009  (JP) .................................. 2009-295809

(51) Int. Cl.
*H01L 27/14*    (2006.01)
*H01L 21/00*    (2006.01)

(52) U.S. Cl.
USPC ............ 257/431; 257/E33.053; 257/E31.095; 438/57

(58) Field of Classification Search
USPC .................. 257/53, 59, 66, 72, 290, E33.053, 257/E31.095, 431, 428, 432, 463; 438/57, 438/96, 97
See application file for complete search history.

(56) References Cited

U.S. PATENT DOCUMENTS

| | | | |
|---|---|---|---|
| 4,823,180 A | | 4/1989 | Wieder et al. |
| 4,847,210 A | * | 7/1989 | Hwang et al. .................. 438/59 |
| 5,435,608 A | * | 7/1995 | Wei et al. ....................... 257/59 |
| 5,461,419 A | | 10/1995 | Yamada |
| 5,912,465 A | * | 6/1999 | Kobayashi et al. ...... 250/370.09 |
| 5,976,978 A | * | 11/1999 | Salisbury ..................... 438/690 |

FOREIGN PATENT DOCUMENTS

| | | | | |
|---|---|---|---|---|
| JP | 58-97877 A | | 6/1983 | |
| JP | 6-133224 A | | 5/1994 | |
| JP | 2005-129909 A | | 5/2005 | |
| JP | 2009-117405 | * | 5/2009 | ............. H01L 21/20 |
| JP | 2009-302192 A | | 12/2009 | |

* cited by examiner

*Primary Examiner* — Nikolay Yushin
(74) *Attorney, Agent, or Firm* — Chen Yoshimura LLP

(57) ABSTRACT

A photosensor element is provided with a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other. The photosensor element has the semiconductor layer provided with an intrinsic semiconductor layer in which a channel region is defined and an extrinsic semiconductor layer that is laminated on the intrinsic semiconductor layer such that the channel region is exposed. The extrinsic semiconductor layer protrudes from the drain electrode on the side close to the channel region.

6 Claims, 9 Drawing Sheets

(a)

(b)

(c)

(d)

(e)

US 8,614,493 B2

PHOTOSENSOR ELEMENT, PHOTOSENSOR CIRCUIT, THIN FILM TRANSISTOR SUBSTRATE, DISPLAY PANEL, AND METHOD FOR MANUFACTURING PHOTOSENSOR ELEMENT

TECHNICAL FIELD

The present invention relates to a photosensor element, a photosensor circuit, a thin-film transistor substrate, a display panel, and a method of manufacturing the photosensor element, and more particularly to a photosensor element using an amorphous semiconductor, a photosensor circuit, a thin-film transistor substrate, a display panel, and a method of manufacturing the photosensor element.

BACKGROUND ART

A thin-film transistor (hereinafter also referred to as "TFT") using amorphous silicon generates a photocurrent when light enters a semiconductor layer thereof, and therefore, in recent years, a display panel with a touch panel function that uses TFTs not only as switching elements for respective pixels, but also as photosensor elements has been proposed.

Patent Document 1, for example, discloses an optical sensor device in which an amorphous silicon photodiode and an amplifier constituted of a thin-film transistor are integrally formed on a substrate.

RELATED ART DOCUMENT

Patent Document

Patent Document 1: Japanese Patent Application Laid-Open Publication No. 2005-129909

SUMMARY OF THE INVENTION

Problems to be Solved by the Invention

FIG. 14 is a cross-sectional view of a conventional photosensor element 106 that is made of a TFT using amorphous silicon.

As shown in FIG. 14, the photosensor element 106 has a typical TFT configuration, that is, the photosensor element 106 has a gate electrode 111 disposed on an insulating substrate 110, a gate insulating film 112 formed so as to cover the gate electrode 111, a semiconductor layer 115 formed in an island shape so as to overlap the gate electrode 111 with the gate insulating film 112 interposed therebetween, and a source electrode 116a and a drain electrode 116b disposed on the semiconductor layer 115 so as to overlap the gate electrode 111 and so as to face each other. As shown in FIG. 14, the semiconductor layer 115 is provided with an intrinsic amorphous silicon layer 113 as a lower layer and an N$^+$ amorphous silicon layer 114 as an upper layer. The intrinsic amorphous silicon layer 113 has a channel region, and the N$^+$ amorphous silicon layer 114 is disposed such that the channel region of the intrinsic amorphous silicon layer 113 is exposed. As shown in FIG. 14, in the photo sensor element 106, when light L enters the semiconductor layer 115 from above, carriers are generated in the intrinsic amorphous silicon layer 113 that is disposed below the inner end of the drain electrode 116b, and a photocurrent is thereby generated.

In the above-mentioned TFT substrate, because TFTs for the photosensor elements can be formed simultaneously with TFTs for the switching elements, a display panel with a touch panel function, for example, can be manufactured at low cost. However, the TFTs for the switching elements and the TFTs for the photosensor elements are provided in the respective pixels, each of which is the smallest unit of an image, and therefore, the aperture ratio of the pixels is lowered. Thus, in the TFTs for the photo sensor element, the reduction in the element size by improving its sensitivity is demanded.

The present invention was made in view of this point, and an object thereof is to improve the sensitivity of the photosensor element.

Means for Solving the Problems

In order to achieve the above-mentioned object, in the present invention, an extrinsic semiconductor layer that constitutes a semiconductor layer protrudes from a drain electrode on the side close to a channel region.

Specifically, a photosensor element according to the present invention is provided with a gate electrode disposed on an insulating substrate, a gate insulating film disposed so as to cover the gate electrode, a semiconductor layer disposed on the gate insulating film so as to overlap the gate electrode, and a source electrode and a drain electrode disposed on the semiconductor layer so as to overlap the gate electrode and so as to face each other, wherein the semiconductor layer has an intrinsic semiconductor layer in which a channel region is defined and an extrinsic semiconductor layer that is laminated on the intrinsic semiconductor layer such that the channel region is exposed, and wherein the extrinsic semiconductor layer protrudes from the drain electrode on the side close to the channel region.

According to the above-mentioned configuration, the extrinsic semiconductor layer that constitutes the semiconductor layer protrudes from the drain electrode on the side close to the channel region. Thus, a top surface of the extrinsic semiconductor layer on the side close to the channel region is exposed from the drain electrode. This makes it easier for light that is to be detected to enter the extrinsic semiconductor layer exposed from the drain electrode, i.e., an inner end of the extrinsic semiconductor layer disposed closer to the drain electrode, and the intrinsic semiconductor layer under the extrinsic semiconductor layer. As a result, the amount of carriers generated in the intrinsic semiconductor layer is increased, and the photocurrent generated in the photosensor element is thereby increased; therefore, the sensitivity of the photosensor element is improved.

FIG. 13 shows results of an experiment that the inventors of the present invention conducted to find out the principle of the present invention. Specifically, FIG. 13 is a graph showing a relationship between the length of a channel region, which is a so-called channel length, and a photocurrent in a typical TFT that uses amorphous silicon. In this experiment, TFTs with the channel lengths of 4 μm, 5 μm, 6 μm, 12 μm, and 20 μm (see the photosensor element 106 in FIG. 14) were prepared. Thereafter, a white light beam and an infrared light beam (850 nm) were radiated to these TFTs, respectively, while applying a bias voltage of 10V to the respective drain electrodes that are connected to the gate electrodes, and the photocurrents generated thereby were measured. In FIG. 13, a line X shows the photocurrent in a dark state; a line Y shows the photocurrent in a bright state in which the infrared light was radiated; and a line Z shows the photocurrent in a bright state in which the white light was radiated. As shown in FIG. 13, in this experiment, the photocurrent (bright current) in the bright state was not dependent on the channel length. From this result, the inventors arrived at the finding that the amount of the photocurrents is determined by the amount of carriers generated in the inner end of the semiconductor layer disposed closer to the drain electrode. That is, in the configuration of the conventional TFT, because the drain electrode was disposed so as to cover the top surface of the extrinsic semiconductor layer, the light utilization efficiency was low.

According to the above-mentioned configuration, the source electrode and the drain electrode overlap the gate electrode, and therefore, it is possible to suppress the increase of the parasitic resistance between the gate electrode and the source and drain electrodes, which suppresses the degradation of the ON characteristics in the photosensor element.

A conductive film that transmits light to be detected may be provided between the extrinsic semiconductor layer and the drain electrode so as to cover the top surface of the extrinsic semiconductor layer.

According to the above-mentioned configuration, because the conductive film that transmits light to be detected is provided on the top surface of the extrinsic semiconductor layer that protrudes from the drain electrode, it is possible to further suppress the increase of the parasitic resistance between the gate electrode and the source and drain electrodes, which further suppresses the degradation of the ON characteristics in the photosensor element.

The above-mentioned conductive film may be a transparent conductive film.

According to this configuration, because a transparent conductive film such as an ITO (Indium Tin Oxide) film, for example, is provided on the top surface of the extrinsic semiconductor layer that protrudes from the drain electrode, in the photosensor element that detects visible light, the degradation of the ON characteristics is specifically suppressed.

The thickness of the conductive film may be 10 nm or less.

According to this configuration, on the top surface of the extrinsic semiconductor layer that protrudes from the drain electrode, an ultrathin conductive film made of silicide with a thickness of 10 nm or less is disposed, for example. Therefore, the degradation of the ON characteristics is specifically suppressed in the photosensor element that detects visible light. If the thickness of the conductive film exceeds 10 nm, the transmittance of the light to be detected is lowered, and it becomes difficult to sufficiently improve the sensitivity of the photosensor element. The lower limit of the thickness of the conductive film is 3 nm or more. If the thickness of the conductive film is less than 3 nm, the effect of suppressing the increase of the parasitic resistance between the gate electrode and the source and drain electrodes is diminished.

The intrinsic semiconductor layer may be made of amorphous silicon.

According to this configuration, because the intrinsic semiconductor layer is made of the amorphous silicon, the function and effect of the present invention are effectively achieved in the photosensor element that detects visible light.

The intrinsic semiconductor layer may be made of crystalline silicon.

According to this configuration, because the intrinsic semiconductor layer is made of the crystalline silicon, the function and effect of the present invention are effectively achieved in the photosensor element that detects infrared light.

The intrinsic semiconductor layer may be made of microcrystalline silicon.

According to this configuration, because the intrinsic semiconductor layer is made of the microcrystalline silicon, it becomes possible to form an intrinsic semiconductor film that forms the intrinsic semiconductor layer by employing the plasma CVD (Chemical Vapor Deposition) method, which allows the photosensor elements to be formed on the substrate with ease by utilizing steps of forming other circuit elements such as switching TFTs for the pixels and TFTs for amplifiers, for example. The grain size of the microcrystalline silicon is about several 10 Å to several 1000 Å, and the microcrystalline silicon is constituted of a mixed-phase of microcrystalline silicon and amorphous silicon.

The photosensor circuit according to the present invention is provided with a photosensor element and an amplifier element connected to the photosensor element, wherein the photosensor element includes a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other, wherein the semiconductor layer has an intrinsic semiconductor layer in which a channel region is defined and an extrinsic semiconductor layer that is laminated on the intrinsic semiconductor layer such that the channel region is exposed, and wherein the extrinsic semiconductor layer protrudes from the drain electrode on the side close to the channel region.

According to this configuration, in the photosensor element, the extrinsic semiconductor layer that constitutes the semiconductor layer protrudes from the drain electrode on the side close to the channel region. Thus, the top surface of the extrinsic semiconductor layer on the side close to the channel region is exposed from the drain electrode. Therefore, it becomes easier for light that is to be detected to enter the extrinsic semiconductor layer exposed from the drain electrode, i.e., the inner end of the extrinsic semiconductor layer that is disposed closer to the drain electrode, and the intrinsic semiconductor layer under the extrinsic semiconductor layer. As a result, the amount of carriers generated in the intrinsic semiconductor layer is increased, and the photocurrent generated in the photosensor element is thereby increased, which improves the sensitivity of the photosensor element in the photosensor circuit provided with the photosensor element and the amplifier element.

The amplifier element may be provided with an amplifier gate electrode disposed on the insulating substrate, the gate insulating film disposed so as to cover the amplifier gate electrode, an amplifier semiconductor layer disposed on the gate insulating film so as to overlap the amplifier gate electrode, and an amplifier source electrode and an amplifier drain electrode provided on the amplifier semiconductor layer so as to overlap the amplifier gate electrode and so as to face each other, wherein the amplifier semiconductor layer has an amplifier intrinsic semiconductor layer in which a channel region is defined and an amplifier extrinsic semiconductor layer that is laminated on the intrinsic semiconductor layer such that the channel region is exposed, and wherein edges of the amplifier extrinsic semiconductor layer on respective sides close to the channel region are aligned to an edge of the amplifier source electrode and an edge of the amplifier drain electrode on the respective sides close to the channel region.

According to this configuration, the amplifier element is provided with the amplifier gate electrode that corresponds to the gate electrode of the photosensor element, the same gate insulating film as that of the photosensor element, the amplifier semiconductor layer that corresponds to the semiconductor layer of the photosensor element, the amplifier source electrode and the amplifier drain electrode that respectively correspond to the source electrode and the drain electrode in the photosensor element, the amplifier intrinsic semiconductor layer that corresponds to the intrinsic semiconductor layer in the photosensor element, and the amplifier extrinsic semiconductor layer that corresponds to the extrinsic semiconductor layer in the photosensor element. While the extrinsic semiconductor layer in the photosensor element on the side close to the channel region protrudes from the drain electrode, the edges of the amplifier extrinsic semiconductor layer on the respective sides close to the channel region are aligned with the edge of the amplifier source electrode and the edge of the amplifier drain electrode on the respective sides close to the channel region. This makes it possible to form the amplifier element by utilizing the process of forming the photosensor element.

The thin-film transistor substrate according to the present invention is provided with a plurality of pixels arranged in a matrix, a plurality of switching elements respectively provided in the pixels, and a plurality of photosensor elements respectively provided in the pixels, wherein each of the photosensor elements includes a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other, wherein the semiconductor layer has an intrinsic semiconductor layer in which a channel region is defined and an extrinsic semiconductor layer that is laminated on the intrinsic semiconductor layer such that the channel region is exposed, and wherein the extrinsic semiconductor layer protrudes from the drain electrode on the side close to the channel region.

According to this configuration, in the photosensor element, the extrinsic semiconductor layer that constitutes the semiconductor layer protrudes from the drain electrode on the side close to the channel region. Thus, the top surface of the extrinsic semiconductor layer on the side close to the channel region is exposed from the drain electrode. This makes it easier for light that is to be detected to enter the extrinsic semiconductor layer exposed from the drain electrode, i.e., the inner end of the extrinsic semiconductor layer disposed closer to the drain electrode, and the intrinsic semiconductor layer under the extrinsic semiconductor layer. As a result, the amount of carriers generated in the intrinsic semiconductor layer is increased, and the photocurrent generated in the photosensor elements is thereby increased, which improves the sensitivity of the photosensor elements in the thin-film transistor substrate in which the switching elements and the photosensor elements are respectively provided in the pixels.

Each of the switching elements may include a switching gate electrode disposed on the insulating substrate, the gate insulating film disposed so as to cover the gate electrode, a switching semiconductor layer disposed on the gate insulating film so as to overlap the switching gate electrode, a switching source electrode and a switching drain electrode provided on the switching semiconductor layer so as to overlap the switching gate electrode and so as to face each other, wherein the switching semiconductor layer has a switching intrinsic semiconductor layer in which a channel region is defined and a switching extrinsic semiconductor layer that is laminated on the intrinsic semiconductor layer such that the channel region is exposed, and wherein an edge of the switching extrinsic semiconductor layer on a side close to the channel region is aligned with an edge of the drain electrode on the side close to the channel region, and wherein a light-shielding layer is disposed so as to cover the respective switching element.

According to this configuration, the switching element in each pixel is provided with the switching gate electrode that corresponds to the gate electrode in the photosensor element, the same gate insulating film as that of the photosensor element, the switching semiconductor layer that corresponds to the semiconductor layer in the photosensor element, the switching source electrode and the switching drain electrode that respectively correspond to the source electrode and the drain electrode in the photosensor element, a switching intrinsic semiconductor layer that corresponds to the intrinsic semiconductor layer in the photosensor element, and the switching extrinsic semiconductor layer that corresponds to the extrinsic semiconductor layer in the photosensor element. While the extrinsic semiconductor layer in the photosensor element protrudes from the drain electrode on the side close to the channel region, the edges of the switching extrinsic semiconductor layer on the respective sides close to the channel region are aligned with an edge of the switching source electrode and an edge of the switching drain electrode on the respective sides close to the channel region. This allows the switching element to be formed by utilizing the process of forming the photosensor element. Further, because the light-shielding layer is disposed so as to cover the switching element of the respective pixel, it becomes possible to suppress the degradation of the OFF characteristics of the switching element.

The thin-film transistor substrate may have a plurality of amplifier elements respectively provided in the pixels, wherein each of the amplifier elements includes an amplifier gate electrode disposed on the insulating substrate, the gate insulating film disposed so as to cover the amplifier gate electrode, an amplifier semiconductor layer disposed on the gate insulating film so as to overlap the amplifier gate electrode, and an amplifier source electrode and an amplifier drain electrode provided on the amplifier semiconductor layer so as to overlap the amplifier gate electrode and so as to face each other, wherein the amplifier semiconductor layer has an amplifier intrinsic semiconductor layer in which a channel region is defined and an amplifier extrinsic semiconductor layer that is laminated on the intrinsic semiconductor layer such that the channel region is exposed, wherein edges of the amplifier extrinsic semiconductor layer on respective sides close to the channel region are aligned with an edge of the amplifier source electrode and an edge of the amplifier drain electrode on the respective sides close to the channel region, and wherein a light-shielding layer is disposed so as to cover the respective amplifier element.

According to this configuration, each of the amplifier elements in the respective pixels is provided with an amplifier gate electrode that corresponds to the gate electrode in the photosensor element, the same gate insulating film as that of the photosensor element, the amplifier semiconductor layer that corresponds to the semiconductor layer in the photosensor element, the amplifier source electrode and the amplifier drain electrode that respectively correspond to the source electrode and the drain electrode in the photosensor element, the amplifier intrinsic semiconductor layer that corresponds to the intrinsic semiconductor layer in the photosensor element, and the amplifier extrinsic semiconductor layer that corresponds to the extrinsic semiconductor layer in the photosensor element. While the photosensor element in the extrinsic semiconductor layer protrudes from the drain electrode on the side close to the channel region, the edges of the amplifier extrinsic semiconductor layer on the respective sides close to the channel region are aligned with an edge of the amplifier source electrode and an edge of the amplifier drain electrode on the respective sides close to the channel region. Therefore, not only the switching elements, but also the amplifier elements can be formed by utilizing the process of forming the photosensor elements. Further, because the light-shielding layer is provided so as to cover the amplifier element of the respective pixel, it becomes possible to suppress the degradation of the characteristics of the amplifier element.

The display panel according to the present invention is provided with a thin-film transistor substrate that has the above-mentioned configuration, an opposite substrate disposed so as to face the thin-film transistor substrate, and a display medium layer disposed between the thin-film transistor substrate and the opposite substrate.

According to the above-mentioned configuration, because the photosensor elements provided in the respective pixels in the thin-film transistor substrate have an increased sensitivity, a display panel with a touch panel function having the high sensitivity can be achieved.

A method of manufacturing the photosensor element according to the present invention includes a first step of forming a gate electrode on an insulating substrate, a second step of forming a gate insulating film so as to cover the gate electrode, a third step of forming a semiconductor structure layer by depositing an intrinsic semiconductor film and an extrinsic semiconductor film in this order so to cover the gate insulating film and by patterning the intrinsic semiconductor film and the extrinsic semiconductor film so as to overlap the gate electrode, and a fourth step of forming a semiconductor layer having an intrinsic semiconductor layer in which a channel region is defined and an extrinsic semiconductor layer that is laminated on the intrinsic semiconductor layer such that the channel region is exposed, a drain electrode that overlaps the gate electrode and that allows the extrinsic semiconductor layer to protrude therefrom on the side close to the channel region, and a source electrode that overlaps the gate electrode and that faces the drain electrode by forming a metal film so as to cover the semiconductor structure layer and by patterning the metal film and the semiconductor structure layer.

According to this method, after the first step, the second step, and the third step are performed in this order, in the subsequent fourth step, a metal film is formed on the semiconductor structure layer that was formed in the third step, and thereafter the metal film and the semiconductor structure layer under the metal film are patterned, thereby forming the semiconductor layer, the drain electrode, and the source electrode. The semiconductor layer that has the intrinsic semiconductor layer in which the channel region is defined and the extrinsic semiconductor layer that is laminated such that the channel region is exposed is disposed so as to overlap the gate electrode that was formed in the first step. The drain electrode is formed so as to allow the extrinsic semiconductor layer to protrude therefrom on the side close to the channel region and so as to overlap the gate electrode that was formed in the first step. The source electrode is formed so as to face the drain electrode and so as to overlap the gate electrode that was formed in the first step. This way, the top surface of the extrinsic semiconductor layer is exposed from the drain electrode on the side close to the channel region. This makes it easier for light that is to be detected to enter the extrinsic semiconductor layer exposed from the drain electrode, i.e., the inner end of the extrinsic semiconductor layer disposed closer to the drain electrode, and the intrinsic semiconductor layer under the extrinsic semiconductor layer. As a result, the amount of carriers generated in the intrinsic semiconductor layer is increased, and the photocurrent generated in the photosensor element is thereby increased, and therefore, the sensitivity of the photosensor elements is improved.

In the above-mentioned fourth step, the source electrode and the drain electrode may be formed by forming, on the metal film, a resist pattern having an opening that becomes the channel region, etching the metal film and the semiconductor structure layer by anisotropic etching using the resist pattern so as to form the intrinsic semiconductor layer and the extrinsic semiconductor layer, and by thereafter etching the metal film by isotropic etching using the resist pattern.

According to this method, in the fourth step, the metal film is etched by isotropic etching using the resist pattern that is used to form the intrinsic semiconductor layer and the extrinsic semiconductor layer. Therefore, the photosensor element in which the extrinsic semiconductor layer that constitutes the semiconductor layer protrudes from both the drain electrode and the source electrode on the respective sides close to the channel region is manufactured.

The above-mentioned fourth step may include: forming, on the metal film, a first resist pattern having an opening that becomes the channel region; etching the metal film and the semiconductor structure layer by anisotropic etching using the first resist pattern so as to form the intrinsic semiconductor layer and the extrinsic semiconductor layer; removing the first resist pattern; forming a second resist pattern that is used for forming at least the drain electrode; and etching the metal film by anisotropic etching using the second resist pattern.

According to this method, in the fourth step, the metal film is etched by anisotropic etching using the second resist pattern, which differs from the first resist pattern used for forming the intrinsic semiconductor layer and the extrinsic semiconductor layer. Therefore, the photosensor element in which the extrinsic semiconductor layer constituting the semiconductor layer protrudes at least from the drain electrode on the side close to the channel region is manufactured.

Effects of the Invention

According to the present invention, the extrinsic semiconductor layer that constitutes the semiconductor layer protrudes from the drain electrode on the side close to the channel region. This makes it possible to improve the sensitivity of the photosensor element.

BRIEF DESCRIPTION OF THE DRAWINGS

FIG. 4 is a cross-sectional view of a photosensor element 6b, which is a modification example of the photosensor element 6a.

FIG. 5 is a cross-sectional view of a photosensor element 6c, which is a modification example of the photosensor element 6a.

DETAILED DESCRIPTION OF EMBODIMENTS

Embodiments of the present invention will be described below in detail referring to figures. The present invention is not limited to the respective embodiments described below.

Embodiment 1

Figure 1:
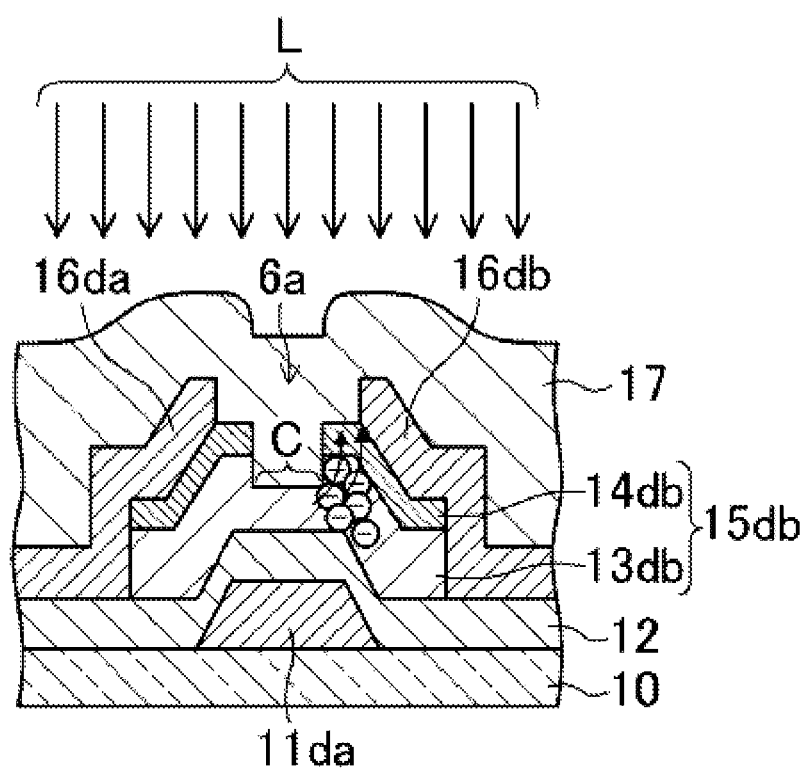
FIG. 1 is a cross-sectional view of a photosensor element 6a according to Embodiment 1.
Figure 2:
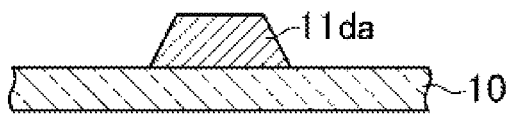
FIG. 2 is an explanatory figure showing steps of manufacturing the photosensor element 6a in cross-sectional views.
Figure 2:
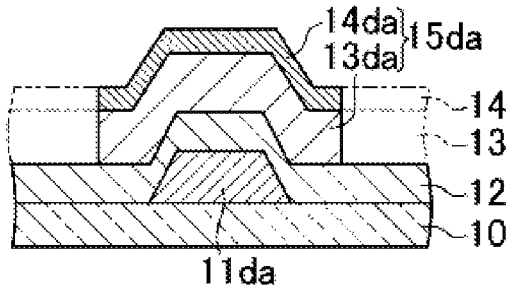
Figure 2:
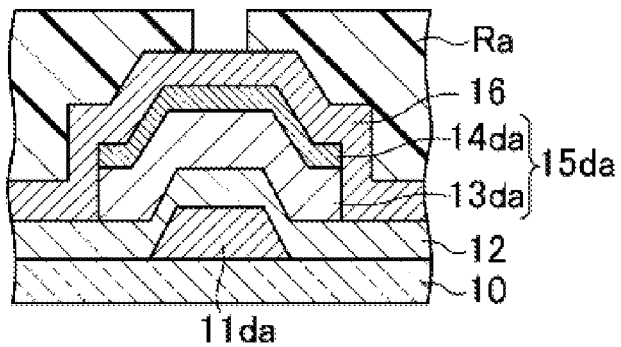
Figure 2:
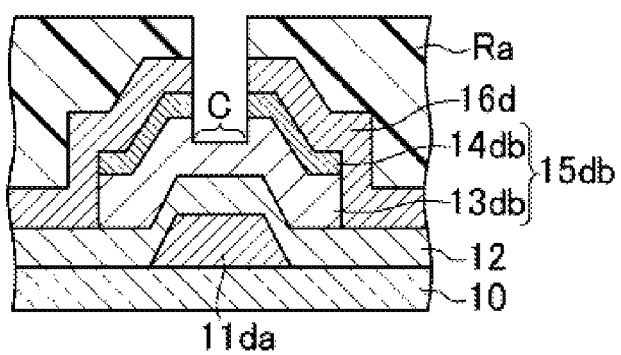
Figure 2:
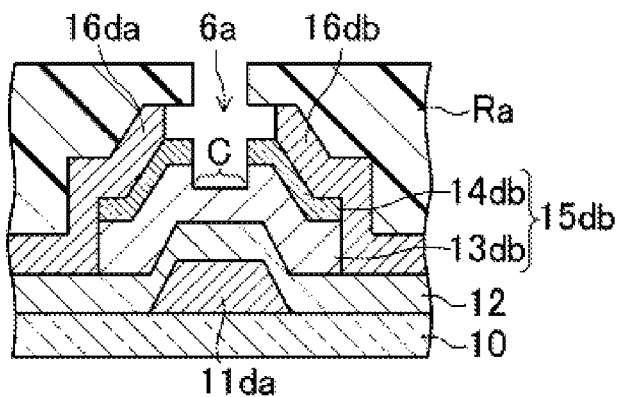
Figure 3:
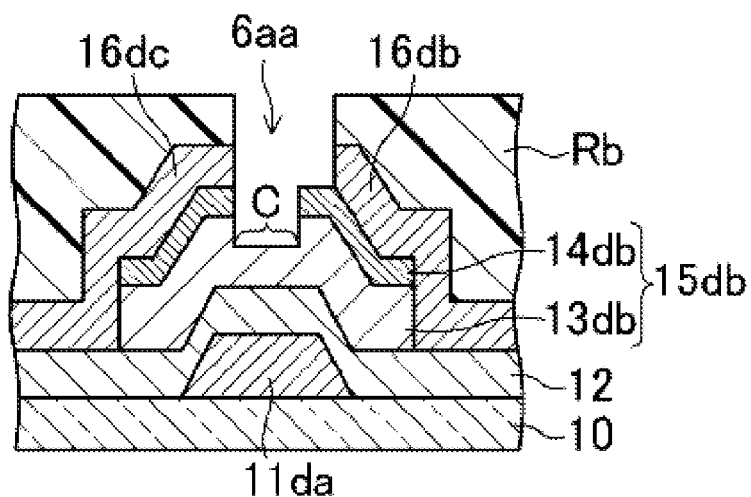
FIG. 3 is an explanatory figure showing a step of manufacturing a photosensor element 6aa, which is a modification example of the photosensor element 6a, in a cross-sectional view.
Figure 4:
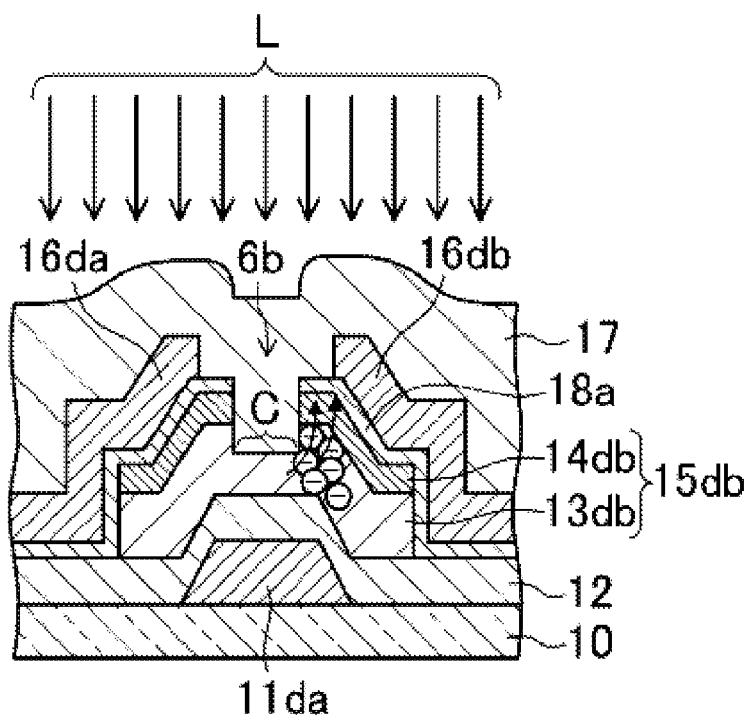
Figure 5:
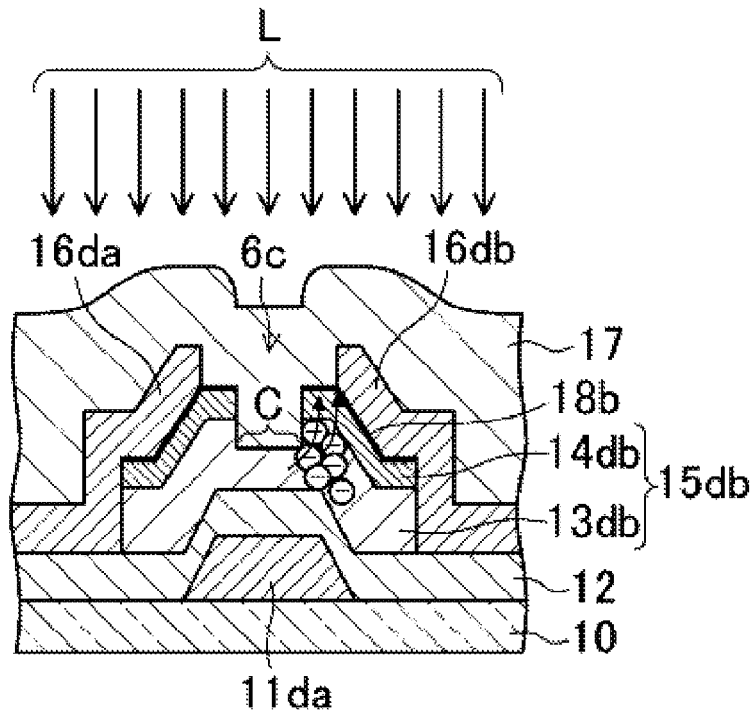

FIGS. 1 to 5 show a photosensor element and a method of manufacturing the photosensor element according to Embodiment 1 of the present invention. Specifically, FIG. 1 is a cross-sectional view of a photosensor element 6a in the present embodiment. FIG. 2 is an explanatory figure showing steps of manufacturing the photosensor element 6a in cross-sectional views. FIG. 3 is an explanatory figure showing a step of manufacturing a photosensor element 6aa, which is a modification example of the photosensor element 6a, in a cross-sectional view. FIGS. 4 and 5 are cross-sectional views of photosensor elements 6b and 6c respectively showing modification examples of the photosensor element 6a.

As shown in FIG. 1, the photosensor element 6a is provided with a gate electrode 11da disposed on an insulating substrate 10, a gate insulating film 12 disposed so as to cover the gate electrode 11da, a semiconductor layer 15db disposed on the gate insulating film 12 so as to overlap the gate electrode 11da, a source electrode 16da and a drain electrode 16db provided on the semiconductor layer 15db so as to overlap the gate electrode 11da and so as to face each other. As shown in FIG. 1, a protective film 17 is provided in the upper layer of the photosensor element 6a.

As shown in FIG. 1, the semiconductor layer 15db is provided with an intrinsic amorphous silicon layer (intrinsic semiconductor layer) 13db in which a channel region C is defined and an N⁺ amorphous silicon layer (extrinsic semiconductor layer) 14db that is laminated on the intrinsic amorphous silicon layer 13db such that the channel region C is exposed.

As shown in FIG. 1, the N⁺ amorphous silicon layer 14db protrudes from the source electrode 16da and from the drain electrode 16db on the respective sides close to the channel region C. The respective lengths from the inner ends of the N⁺ amorphous silicon layer 14db to the respective inner ends of the source electrode 16da and the drain electrode 16db, i.e., the protruding length of the N⁺ amorphous silicon layer 14db, is about 0.3 μm to 3 μm. If the protruding length of the N⁺ amorphous silicon layer 14db is less than 0.3 μm, the sensitivity of the photosensor element 6a is not sufficiently improved. If the protruding length of the N⁺ amorphous silicon layer 14db is more than 3 μm, the size of the photosensor element 6a becomes too large.

Next, a method of manufacturing the photosensor element 6a of the present embodiment will be described referring to FIG. 2.

First, on the entire insulating substrate 10 that is a glass substrate or the like, a titanium film (about 50 nm thick), an aluminum film (about 200 nm thick), a titanium film (about 150 nm thick), and the like are formed in this order by sputtering, for example. Thereafter, the multilayer metal film is patterned by photolithography, thereby forming the gate electrode 11da as shown in FIG. 2(a) (first step).

Next, on the entire substrate having the gate electrode 11da formed thereon, the gate insulating film 12 (see FIG. 2(b)) is formed by depositing an inorganic insulating film such as a silicon nitride film or a silicon oxide film (about 400 nm thick), for example, by the plasma CVD method (second step).

Further, as shown in FIG. 2(b), on the entire substrate having the gate insulating film 12 formed thereon, an intrinsic amorphous silicon film 13 as an intrinsic semiconductor film (about 20 nm to 200 nm thick), an N⁺ amorphous silicon film 14 as an extrinsic semiconductor film (about 50 nm thick), and the like are formed in this order by the plasma CVD method. Thereafter, the semiconductor multilayer film that is constituted of the intrinsic amorphous silicon film 13 and the N⁺ amorphous silicon film 14 is patterned by photolithography, thereby forming a semiconductor structure layer 15da that is constituted of the intrinsic amorphous silicon layer 13da and the N⁺ amorphous silicon layer 14da (third step). In the present embodiment, the amorphous silicon (a-Si) film for detecting visible light is described as an example of the intrinsic semiconductor film, but in detecting infrared light, an amorphous silicon germanium (a-SiGe) film may be used, and in detecting ultraviolet light, an amorphous silicon carbide (a-SiC) film may be used. As described above, when the amorphous semiconductor is used, the optical absorption can be increased, and the detection sensitivity can therefore be improved. Here, if the thickness of the intrinsic amorphous silicon film 13 is less than 20 nm, the sufficient detection sensitivity cannot be ensured.

Next, as shown in FIG. 2(c), on the entire substrate having the semiconductor structure layer 15da formed thereon, a metal film 16 is formed by depositing a titanium film (about 100 nm thick), an aluminum film (about 200 nm thick), and the like in this order by sputtering, for example, and thereafter, a resist pattern Ra is formed on the metal film 16.

Next, as shown in FIG. 2(d), by removing the metal film 16 exposed from the resist pattern Ra and the semiconductor structure layer 15da under the metal film 16 by anisotropic dry etching, the semiconductor layer 15db that is constituted of the intrinsic amorphous silicon layer 13db and the N⁺ amorphous silicon layer 14db, and a metal layer 16d are formed.

Next, as shown in FIG. 2(e), the metal layer 16d is removed by isotropic wet etching using the resist pattern Ra, and the source electrode 16da and the drain electrode 16db are formed (fourth step).

Lastly, after the resist pattern Ra is removed, an inorganic insulating film such as a silicon nitride film and a silicon oxide film (about 400 nm thick), for example, is deposited by the plasma CVD method so as to cover the source electrode 16da and the drain electrode 16db, thereby forming the protective film 17.

In the manner described above, the photosensor element 6a of the present embodiment can be manufactured.

As described above, according to the photosensor element 6a and the manufacturing method thereof in the present embodiment, after the first step, the second step, and the third step are performed in this order, the subsequent fourth step is performed as follows: forming the metal film 16 on the semiconductor structure layer 15da that was formed in the third step; patterning the metal film 16 and the semiconductor structure layer 15da under the metal film 16 by anisotropic etching using the resist pattern Ra so as to form the semiconductor layer 15db, which has the intrinsic amorphous silicon layer 13db in which the channel region C is defined and the N+ amorphous silicon layer 14db laminated such that the channel region C is exposed, so as to overlap the gate electrode 11da that was formed in the first step; patterning the metal layer 16d by isotropic etching using the resist pattern Ra, thereby forming the source electrode 16da and the drain electrode 16db that overlap the gate electrode 11da formed in the first step and that face each other such that the N+ amorphous silicon layer 14db protrudes therefrom on the respective sides close to the channel region C. Therefore, the top surfaces of the N+ amorphous silicon layer 14db are exposed from the source electrode 16da and from the drain electrode 16db on the sides close to the channel region C. This makes it easier for visible light that is to be detected to enter the N+ amorphous silicon layer 14db exposed from the drain electrode 16db, i.e., the inner end of the N+ amorphous silicon layer 14db disposed closer to the drain electrode 16db, and the intrinsic amorphous silicon layer 13db under the N+ amorphous silicon layer 14db. As a result, the amount of carriers generated in the intrinsic amorphous silicon layer 13db is increased, and the photocurrent generated in the photosensor element 6a is thereby increased, and therefore, the sensitivity of the photosensor element 6a is improved.

According to the photosensor element 6a of the present embodiment, the source electrode 16da and the drain electrode 16db overlap the gate electrode 11da. Therefore, it becomes possible to suppress the increase of the parasitic resistance between the gate electrode 11da and the source electrode 16da and the drain electrode 16db, which suppresses the degradation of the ON characteristics in the photosensor element 6a.

In the present embodiment, the photosensor element 6a in which the N+ amorphous silicon layer 14db protrudes from the drain electrode 16db and from the source electrode 16da on the sides close to the channel region C, and the manufacturing method thereof were described as an example. However, as shown in FIG. 3, it is also possible to configure a photosensor element 6aa in which the N+ amorphous silicon layer 14db protrudes only from the drain electrode 16db on the side close to the channel region C. In this case, the source electrode 16dc and the drain electrode 16db are formed as follows: removing the metal film 16 that is exposed from the resist pattern (first resist pattern) Ra and the semiconductor structure layer 15da under the metal film 16 by anisotropic dry etching so as to form the semiconductor layer 15db and the metal layer 16d as shown in FIG. 2(d); removing the first resist pattern Ra; forming a second resist pattern Rb that is used for forming the drain electrode 16db as shown in FIG. 3; and removing the metal layer 16d that is exposed from the second resist pattern Rb by anisotropic dry etching.

In the present embodiment, the photosensor element 6a in which the source electrode 16da and the drain electrode 16db are directly formed on the N+ amorphous silicon layer 14db was described as an example. However, as shown in FIGS. 4 and 5, a conductive film (18a or 18b) that transmits light to be detected may be provided between the N+ amorphous silicon layer 14db and the source electrode 16da and the drain electrode 16db so as to cover the top surface of the N+ amorphous silicon layer 14db. Specifically, in the photosensor element 6b shown in FIG. 4, a transparent conductive film 18a is disposed so as to cover the top surface of the N+ amorphous silicon layer 14db. This transparent conductive film 18a is a conductive film that does not absorb light that is in the same wavelength as that of the light to be detected (the transmittance is 80% or more). In detecting visible light, for example, the transparent conductive film 18a is made of an ITO film, an IZO (Indium Zinc Oxide) film, a ZnO film, or the like. In the photosensor element 6c shown in FIG. 5, an ultrathin conductive film 18b with a thickness of 10 nm or less is disposed so as to cover the top surface of the N+ amorphous silicon layer 14db. In detecting visible light, for example, a silicide conductive film made of titanium silicide, nickel silicide, cobalt silicide, copper silicide, or the like is used as this conductive film 18b. In the photosensor elements 6b and 6c having such configurations, the transparent conductive film 18a and the conductive film 18b that transmit light to be detected are respectively provided on the top surfaces of the N+ amorphous silicon layer 14db that protrude from the source electrode 16da and from the drain electrode 16db. Therefore, it becomes possible to further suppress the increase of the parasitic resistance between the gate electrode 11da and the source electrode 16da and the drain electrode 16ba, which further suppresses the degradation of the ON characteristics in the photosensor elements 6b and 6c.

Embodiment 2

Figure 6:
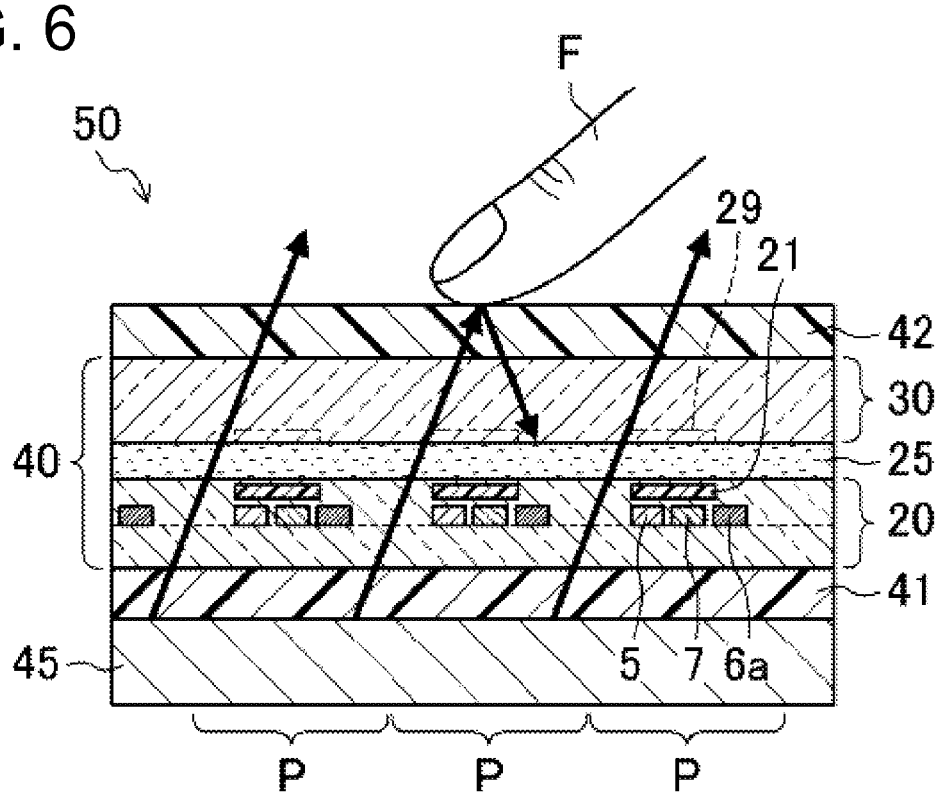
FIG. 6 is a cross-sectional view of a liquid crystal display device 50 according to Embodiment 2.
Figure 7:
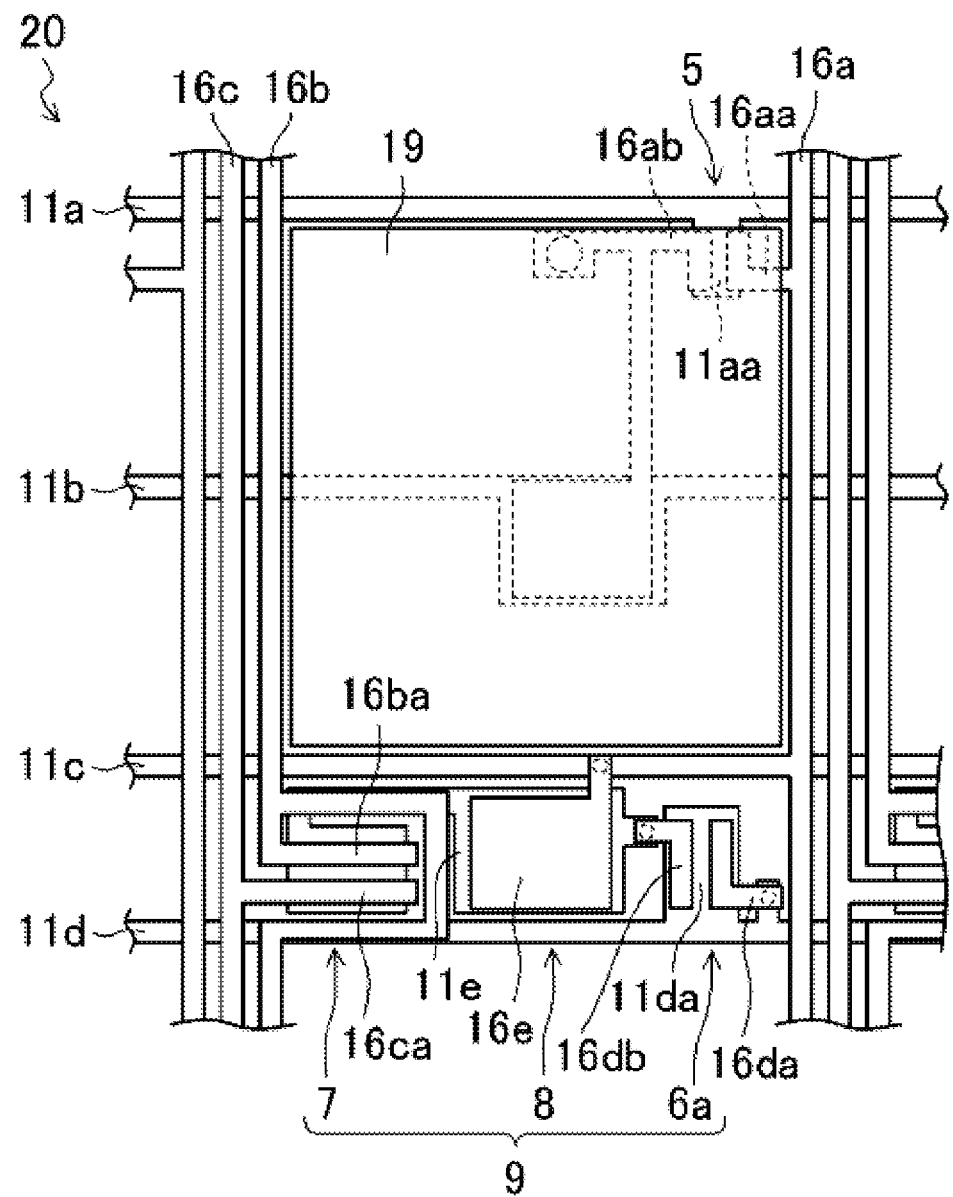
FIG. 7 is a plan view of a TFT substrate 20 that constitutes the liquid crystal display device 50.
Figure 8:
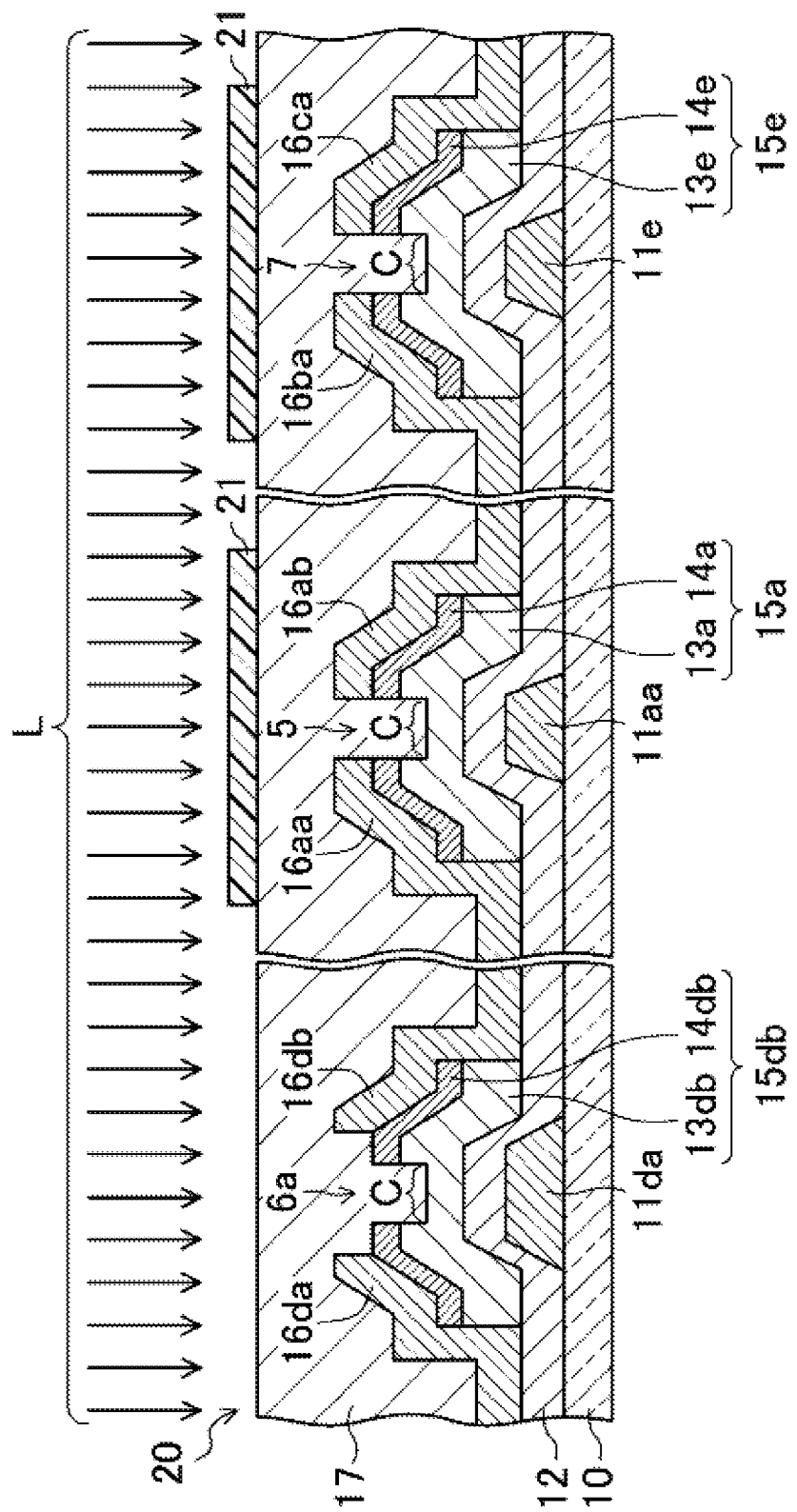
FIG. 8 is a cross-sectional view of the TFT substrate 20.
Figure 9:
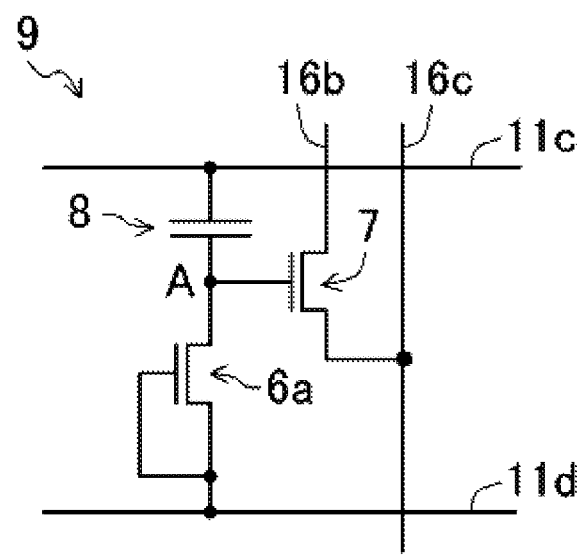
FIG. 9 is an equivalent circuit diagram of a photosensor circuit 9 included in the TFT substrate 20.
Figure 10:
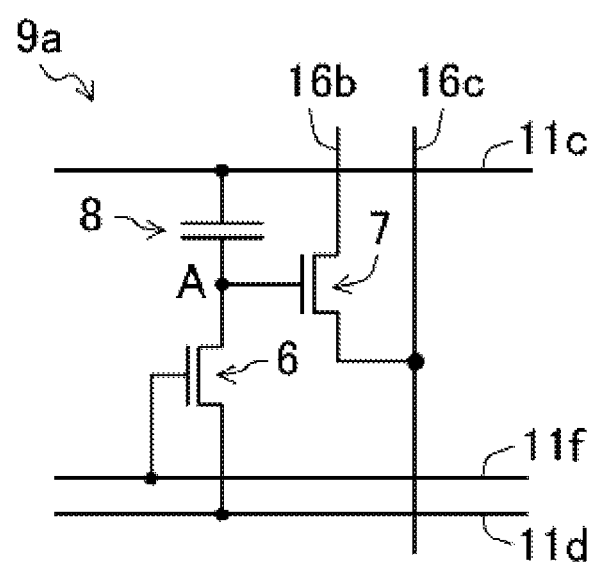
FIG. 10 is an equivalent circuit diagram of a photosensor circuit 9a, which is a modification example of the photosensor circuit 9.
Figure 11:
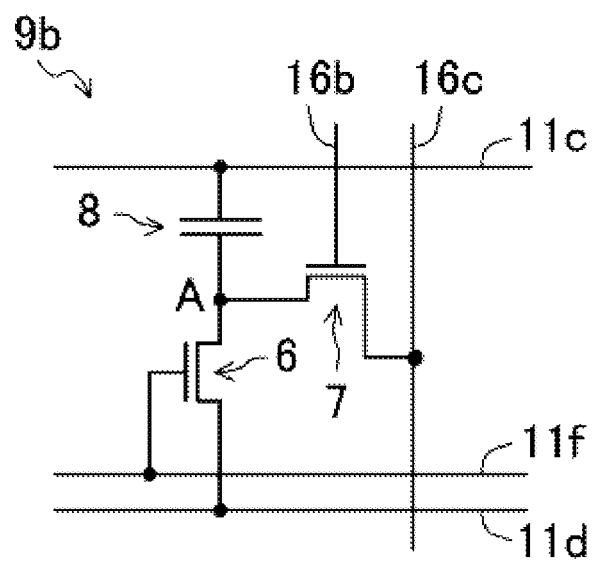
FIG. 11 is an equivalent circuit diagram of a photosensor circuit 9b, which is a modification example of the photosensor circuit 9.
Figure 12:
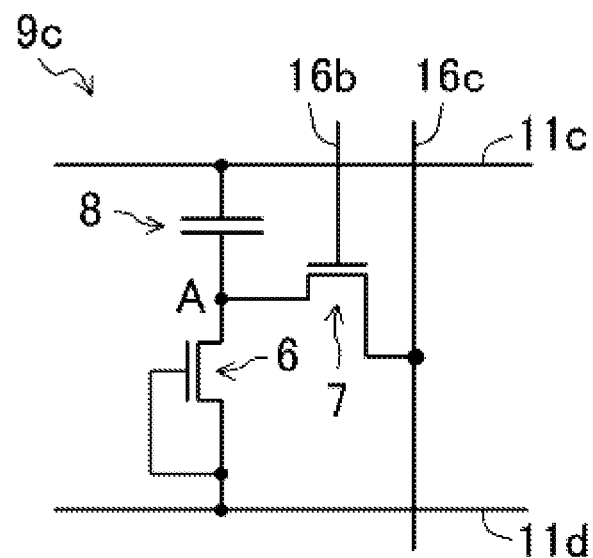
FIG. 12 is an equivalent circuit diagram of a photosensor circuit 9c, which is a modification example of the photosensor circuit 9.
Figure 13:
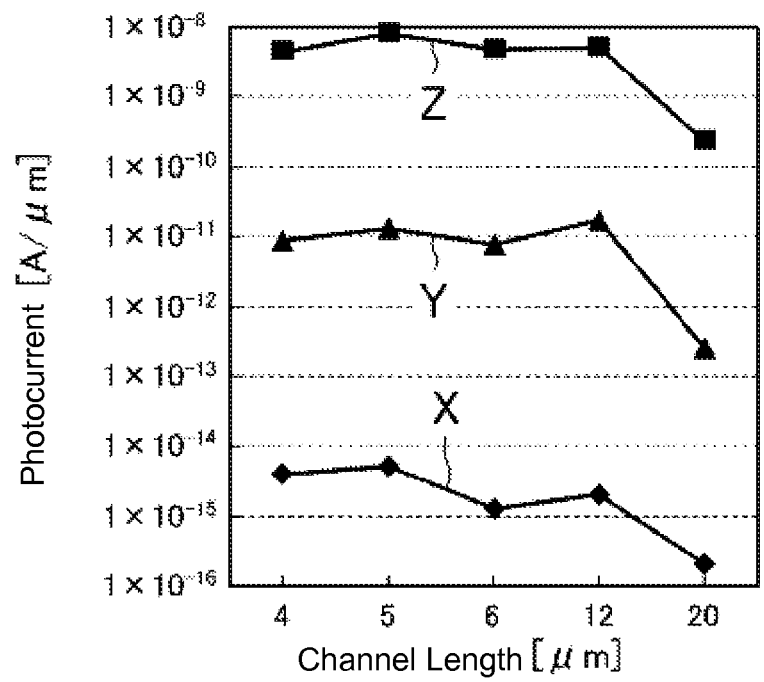
FIG. 13 is a graph showing a relationship of a channel length with a photocurrent in a typical TFT that uses amorphous silicon.
Figure 14:
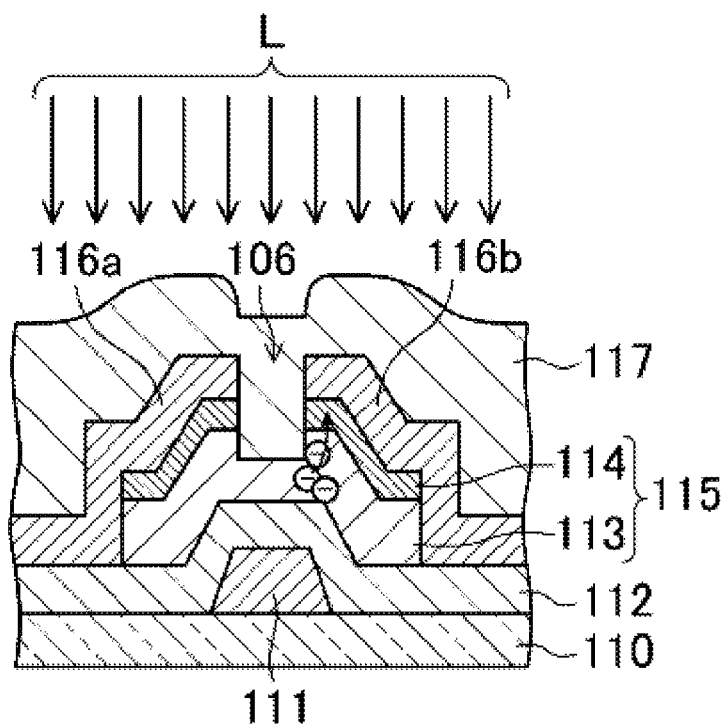
FIG. 14 is a cross-sectional view of a conventional photosensor element 106 that includes a TFT.

FIGS. 6 to 12 show a photosensor element, a photosensor circuit, a TFT substrate, a display panel, and a method of manufacturing a photosensor element according to Embodiment 2 of the present invention. Specifically, FIG. 6 is a cross-sectional view of a liquid crystal display device 50 of the present embodiment. FIG. 7 is a plan view of a TFT substrate 20 that constitutes the liquid crystal display device 50. FIG. 8 is a cross-sectional view of the TFT substrate 20. FIG. 9 is an equivalent circuit diagram of a photosensor circuit 9 that is included in the TFT substrate 20. FIGS. 10, 11, and 12 are equivalent circuit diagrams of photosensor circuits 9a, 9b, and 9c respectively showing modification examples of the photosensor circuit 9. In the embodiment below, the same reference characters are given to the same parts as those of FIGS. 1 to 5, and the detailed descriptions thereof are omitted.

As shown in FIG. 6, the liquid crystal display device 50 is provided with a liquid crystal display panel 40 that displays images, a polarizing plate 41 bonded on the rear surface side of the liquid crystal display panel 40, a polarizing plate 42 bonded on the front surface side of the liquid crystal display panel 40, and a backlight 45 provided on the rear surface side of the liquid crystal display panel 40 having the polarizing plate 41 interposed therebetween. The liquid crystal display device 50 is configured such that the photosensor elements 6a and the like provided in respective pixels P, each of which is the smallest unit of an image, detect a touch position based on a light intensity difference caused by presence or absence of a finger F on the surface of the polarizing plate 42.

As shown in FIG. 6, the liquid crystal display panel 40 is provided with a TFT substrate 20 and an opposite substrate 30 that are disposed so as to face each other, and a liquid crystal layer 25 that is provided as a display medium layer between the TFT substrate 20 and the opposite substrate 30 and that is sealed by a frame-shaped sealing material (not shown).

As shown in FIGS. 7 and 9, the TFT substrate 20 is provided with a plurality of gate lines 11a arranged so as to extend in parallel to each other along the horizontal direction in the figures, capacitance lines 11b, select wiring lines 11c, and initialization wiring lines 11d arranged so as to extend in parallel to each other between the respective gate lines 11a, a plurality of source lines 16a arranged so as to extend in parallel to each other along the vertical direction in the figures, power-supply voltage wiring lines 16b and output wiring lines 16c arranged near the respective source lines 16a so as to extend in parallel to each other, switching elements 5 disposed at the respective intersections of the gate lines 11a and the source lines 16a, i.e., in the respective pixels P, photosensor circuits 9 disposed between the select wiring lines 11c and the initialization wiring lines 11d, respectively, in the respective pixels P, a protective film 17 disposed so as to cover the respective switching elements 5 and the photosensor circuits 9 (see FIG. 8), a plurality of pixel electrodes 19 arranged in a matrix on the protective film 17, and an alignment film (not shown) disposed so as to cover the respective pixel electrodes 19.

As shown in FIGS. 7 and 8, the switching element 5 is provided with a switching gate electrode 11aa disposed on the insulating substrate 10, a gate insulating film 12 disposed so as to cover the switching gate electrode 11aa, a switching semiconductor layer 15a formed in an island shape on the gate insulating film 12 so as to overlap the switching gate electrode 11a, and a switching source electrode 16aa and a switching drain electrode 16ab provided on the switching semiconductor layer 15a so as to overlap the switching gate electrode 11aa and so as to face each other. As shown in FIG. 7, the switching gate electrode 11aa is a portion of the gate line 11a that protrudes to the side, and the switching source electrode 16aa is a portion of the source line 16a that protrudes to the side. As shown in FIG. 7, the switching drain electrode 16ab is connected to the pixel electrode 19 via a contact hole (a dashed circle in the figure) formed in the protective film 17 (see FIG. 8), and overlaps the capacitance line 11b through the gate insulating film 12 (see FIG. 8), thereby forming an auxiliary capacitance. Further, as shown in FIG. 8, the switching semiconductor layer 15a is provided with a microcrystalline silicon layer (switching intrinsic semiconductor layer) 13a in which the channel region C is defined and an N+ amorphous silicon layer (switching extrinsic semiconductor layer) 14a that is laminated on the microcrystalline silicon layer 13a such that the channel region C is exposed.

As shown in FIGS. 7 and 9, the photosensor circuit 9 is provided with the photosensor element 6a that has a microcrystalline silicon layer made of microcrystalline silicon as the intrinsic semiconductor layer, instead of the intrinsic semiconductor layer made of amorphous silicon described in Embodiment 1 above, an amplifier element 7 that is connected to the photosensor element 6a, and a capacitor element 8 that is connected to the photosensor element 6a and the amplifier element 7.

As shown in FIG. 7, in the photosensor element 6a, the gate electrode 11da is a portion of the initialization wiring line 11d that protrudes to the side. The source electrode 16da is connected to the initialization wiring line 11d via a contact hole (a dashed circle in the figure) formed in the gate insulating film 12. The drain electrode 16db is connected to the capacitor element 8 (to the lower electrode 11e thereof, which will be described later) via a contact hole (a dashed circle in the figure) formed in the gate insulating film 12. In the present embodiment, the photosensor element 6a was described as an example, but the photosensor elements 6aa, 6b, 6c, and the like, which were shown in Embodiment 1 above as modification examples, may also be used.

As shown in FIGS. 7, 8, and 9, the amplifier element 7 is provided with an amplifier gate electrode 11e disposed on the insulating substrate 10, the gate insulating film 12 disposed so as to cover the amplifier gate electrode 11e, an amplifier semiconductor layer 15e formed in an island shape on the gate insulating film 12 so as to overlap the amplifier gate electrode 11e, and an amplifier source electrode 16ba and an amplifier drain electrode 16ca provided on the amplifier semiconductor layer 15e so as to overlap the amplifier gate electrode 11e and so as to face each other. As shown in FIG. 7, the amplifier source electrode 16ba is a branched part of the power-supply voltage wiring line 16b. As shown in FIG. 7, the amplifier drain electrode 16ca is a portion of the output wiring line 16c that protrudes to the side. As shown in FIG. 8, the amplifier semiconductor layer 15e is provided with a microcrystalline silicon layer (amplifier intrinsic semiconductor layer) 13e in which the channel region C is defined and an N+ amorphous silicon layer (amplifier extrinsic semiconductor layer) 14e that is laminated on the microcrystalline silicon layer 13e such that the channel region C is exposed.

As shown in FIGS. 7 and 9, a capacitor element 8 is provided with a lower electrode (11e) connected to the amplifier gate electrode 11e, a gate insulating film 12 disposed so as to cover the lower electrode (11e), and an upper electrode 16e arranged on the gate insulating film 12 so as to overlap the lower electrode (11e).

As shown in FIGS. 6 and 8, in the TFT substrate 20, light-shielding layers 21 are disposed so as to cover the switching element 5 and the amplifier element 7. It should be noted that the light-shielding layers 21 are not shown in the TFT substrate 20 in FIG. 7, and the pixel electrodes 19 are not shown in the TFT substrate 20 in FIG. 8.

The opposite substrate 30 is provided with a black matrix (not shown) disposed on an insulating substrate (not shown) in a grid pattern, a plurality of colored layers (not shown) such as red layers, green layers, and blue layers respectively disposed in the respective grids of the black matrix, a common electrode (not shown) disposed so as to cover the black matrix and the respective colored layers, photospacers (not shown) in a columnar shape disposed on the common electrode, and an alignment film (not shown) disposed so as to cover the common electrode. In the present embodiment, the configuration in which the light-shielding layers 21 that block light from entering the switching element 5 and the amplifier element 7 are provided in the TFT substrate 20 is described as an example, but alternatively, light-shielding layers 29 (see a two-dot chain line in FIG. 6) may be provided in the opposite substrate 30 using the black matrix on the opposite substrate 30, for example.

The liquid crystal layer 25 is made of a nematic liquid crystal material or the like having electrooptic characteristics.

In the liquid crystal display device 50 having the above-mentioned configuration, an image is displayed in the following manner: when a scan signal is sent to the switching gate electrodes 11aa of the switching elements 5 in the respective pixels P through the gate lines 11a, and the switching elements 5 are thereby turned on, display signals are sent to the switching source electrodes 16aa through the source lines 16a, and prescribed electric charges are written in the respective pixel electrodes 19 through the switching semiconductor layers 15a and the switching drain electrodes 16ab; this creates electrical potential differences between the respective pixel electrodes 19 in the TFT substrate 20 and the common electrode in the opposite substrate 30 in the liquid crystal display device 50, and therefore, prescribed voltages are applied to the liquid crystal layer 25; and by changing the size of the voltages applied to the liquid crystal layer 25, the orientation state of the liquid crystal layer 25 in the respective pixels P is changed, which adjusts light transmittance of the liquid crystal layer 25, and an image is thereby displayed in the liquid crystal display device 50.

In the liquid crystal display device 50 having the above-mentioned configuration, in the respective pixels P, by setting the potential of the initialization wiring lines 11d to a high level, the potential of the respective intersections A of the photosensor elements 6a, the amplifier elements 7, and the capacitor elements 8 is reset, and is set to the high level. Then, while the potential at the intersections A is at the high level, the potential of the initialization wiring lines 11*d* is set to a low level, thereby turning the photosensor elements 6*a* off. If the photosensor elements 6*a* in the respective pixels P of the liquid crystal display device 50 receive light at this time, a large voltage drop occurs due to the photocurrent, and therefore, when the finger F touches the surface of the polarizing plate 42, the potential difference occurs between the intersections A of the pixels P that receive light (receive strong light) and the intersections A of the pixels P that do not receive light (receive weak light). Thereafter, in the liquid crystal display device 50, by setting the potentials of the select wiring lines 11*c* and the power-supply voltage wiring lines 16*b* to a high level, detection signals corresponding to the potential difference at the intersections A are output through the output wiring lines 16*c*. Output signals corresponding to the voltages/currents of the output detection signals are read out by a control LSI (Large Scale Integration), and the control LSI recognizes the pixels P that received light and the pixels P that did not receive light based on an algorithm for the potential difference, the current difference, the voltage absolute value, or the current absolute value, for example, of the output signals and identifies presence or absence of a touch. In this manner, the point touched by the finger F on the surface of the polarizing plate 42 is detected.

Next, a method of manufacturing the TFT substrate 20 that constitutes the liquid crystal display device 50 of the present embodiment and that has the photosensor elements 6*a* will be described referring to FIGS. 2 and 8.

First, on the entire insulating substrate 10 that is a glass substrate or the like, a titanium film (about 50 nm thick), an aluminum film (about 200 nm thick), a titanium film (about 150 nm thick) and the like, for example, are deposited in this order by sputtering. Next, the multilayer metal film is patterned by photolithography, thereby forming the gate lines 11*a*, the capacitance lines 11*b*, the select wiring lines 11*c*, the initialization wiring lines 11*d*, the switching gate electrodes 11*aa*, the gate electrodes 11*da* (for the photosensor element), and the amplifier gate electrodes 11*e* as shown in FIGS. 2(*a*) and 8 (first step).

Next, on the entire substrate having the gate lines 11*a*, the capacitance lines 11*b*, the select wiring lines 11*c*, the initialization wiring lines 11*d*, the switching gate electrodes 11*aa*, the gate electrodes 11*da*, and the amplifier gate electrodes 11*e* formed thereon, an inorganic insulating film (about 400 nm thick) such as a silicon nitride film or a silicon oxide film, for example, is deposited by the plasma CVD method, and by patterning the inorganic insulating film by photolithography, the gate insulating film 12 having contact holes (see FIGS. 2(*b*) and 8) is formed (second step).

Further, as shown in FIG. 2(*b*), on the entire substrate having the gate insulating film 12 formed thereon, a microcrystalline silicon film 13 as an intrinsic semiconductor film (about 20 nm to 200 nm thick), an N$^+$ amorphous silicon film 14 as an extrinsic semiconductor film (about 50 nm thick), and the like are laminated in this order by the plasma CVD method. Thereafter, by patterning the semiconductor multilayer film made of the microcrystalline silicon film 13 and the N$^+$ amorphous silicon film 14 by photolithography, a semiconductor structure layer 15*da* made of the microcrystalline silicon layer 13*da* and the N$^+$ amorphous silicon layer 14*da*, and not-shown other semiconductor structure layers (for the switching elements and the amplifier elements) are formed (third step).

Next, as shown in FIG. 2(*c*), on the entire substrate in which the semiconductor structure layer 15*da* and the other semiconductor structure layers are formed, a metal film 16 is formed by laminating an aluminum film (about 200 nm thick), a titanium film (about 100 nm thick), and the like in this order, for example, by sputtering, and thereafter, a resist pattern Ra is formed on the metal film 16.

Next, as shown in FIGS. 2(*d*) and 8, anisotropic dry etching is performed to remove the metal film 16 exposed from the resist pattern Ra, the semiconductor structure layer 15*da* under the metal film 16, and the other semiconductor structure layers, thereby forming the semiconductor layer 15*db* for the photosensor elements made of the microcrystalline silicon layer 13*db* and the N$^+$ amorphous silicon layer 14*db*, the switching semiconductor layer 15*a* made of the microcrystalline silicon layer 13*a* and the N$^+$ amorphous silicon layer 14*a*, the amplifier semiconductor layer 15*e* made of the microcrystalline silicon layer 13*e* and the N$^+$ amorphous silicon layer 14*e*, the source lines 16*a*, the power-supply voltage wiring line 16*b*, the output wiring line 16*c*, the switching source electrodes 16*aa*, the switching drain electrodes 16*ab*, the amplifier source electrodes 16*ba*, the amplifier drain electrodes 16*ca*, and the metal layer 16*d*.

Thereafter, as shown in FIG. 2(*e*), the meal layer 16*d* is removed by isotropic wet etching using the resist pattern Ra, and the source electrodes 16*da* and the drain electrodes 16*db* for the photosensor elements are thereby formed (fourth step).

Next, after the resist pattern Ra is removed, an inorganic insulating film (about 400 nm thick) such as a silicon nitride film or a silicon oxide film, for example, is deposited by the plasma CVD method so as to cover the semiconductor layers 15*db* (for the photosensor elements 6*a*), the switching semiconductor layers 15*a*, the amplifier semiconductor layers 15*e*, the source lines 16*a*, the power-supply voltage wiring lines 16*b*, the output wiring lines 16*c*, the switching source electrodes 16*aa*, the switching drain electrodes 16*ab*, the amplifier source electrodes 16*ba*, the amplifier drain electrodes 16*ca*, and the source electrodes 16*da* and the drain electrodes 16*db* (for the photosensor elements 6*a*). Thereafter, the inorganic insulating film is patterned by photolithography, and as a result, as shown in FIG. 8, the protective film 17 having contact holes is formed.

Next, on the entire substrate having the protective film 17 formed thereon, a black photosensitive resin film or the like containing carbon particles is formed by the spin coat method, for example. Thereafter, by performing exposure and development to the photosensitive resin film, as shown in FIG. 8, the light-shielding layers 21 are formed. In the present embodiment, the light-shielding layers 21 made of the black photosensitive resin film are described as an example, but the light-shielding layers 21 may be made of a chromium film or the like.

Lastly, on the entire surface of the substrate in which the light-shielding layers 21 are formed, a transparent conductive film such as an ITO film (about 100 nm thick), for example, is deposited by sputtering. Thereafter, the transparent conductive film is patterned by photolithography, thereby forming the pixel electrodes 19 as shown in FIG. 7.

In this manner, the TFT substrate 20 of the present embodiment can be manufactured.

As described above, according to the method of manufacturing the photosensor element 6*a*, the photosensor circuit 9, the TFT substrate 20, the liquid crystal display panel 40, and the TFT substrate 20 in the present embodiment, in the same manner as Embodiment 1 above, it becomes easier for light that is to be detected to enter the inner end of the N$^+$ amorphous silicon layer 14*db* disposed closer to the drain electrode 16*db*, and the microcrystalline silicon layer 13*db* under the N⁺ amorphous silicon layer 14db in the photosensor element 6a. This allows for an increase in the amount of carriers generated in the microcrystalline silicon layer 13db and in the photocurrents generated in the photosensor element 6a, and therefore, the sensitivity of the photosensor element 6a can be improved.

According to the method of manufacturing the TFT substrate 20 of the present embodiment, the amorphous semiconductor layer is made of the microcrystalline silicon. Therefore, the intrinsic semiconductor film that forms the intrinsic semiconductor layer can be deposited by the plasma CVD method. As a result, the photosensor element 6a can be formed on the insulating substrate 10 with ease by utilizing the process of forming other circuit elements such as TFTs for switching elements and TFTs for amplifier elements of the pixels P.

In the TFT substrate 20 of the present embodiment, in the photosensor element 6a, the N⁺ amorphous silicon layer 14db protrudes from the drain electrode 16db on the side close to the channel region C. On the other hand, in the switching element 5, the edges of the N⁺ amorphous silicon layer 14a on the sides close to the channel region C are aligned with an edge of the switching source electrode 16aa and an edge of the switching drain electrode 16ab on the sides close to the channel region C, and in the amplifier element 7, the edges of the N⁺ amorphous silicon layer 14e on the sides close to the channel region C are aligned with an edge of the amplifier source electrode 16ba and an edge of the amplifier drain electrode 16ca on the sides close to the channel region C. Therefore, not only the switching element 5, but also the amplifier element 7 can be formed by utilizing the process of forming the photosensor element. Also, because the light-shielding layers 21 are arranged so as to cover the switching elements 5 and the amplifier elements 7 in the respectively pixels P, it becomes possible to suppress the degradation of the OFF characteristics of the switching element 5, and to suppress the degradation of the characteristics of the amplifier element 7.

In the present embodiment, the photosensor circuit 9 having the configuration shown in FIG. 9 was described as an example, but photosensor circuits 9a, 9b, and 9c that are respectively shown in FIGS. 10, 11, and 12 may also be used. In the respective photosensor circuits 9a, 9b, and 9c in FIGS. 10, 11 and 12, the photosensor elements 6a, 6aa, 6b, or 6c in Embodiment 1 above can be employed, and they are collectively referred to as a photosensor element 6. Specifically, as shown in FIG. 10, in the photosensor circuit 9a, a reset wiring line 11f is arranged so as to be adjacent to the initialization wiring line 11d. The gate electrode of the photosensor element 6 is connected to the reset wiring line 11f, and the source electrode of the photosensor element 6 is connected to the initialization wiring line 11d. Therefore, the voltage of the initialization wiring line 11d and the reset wiring line 11f can be individually set, which allows for more stable operation as compared with the photosensor circuit 9. As shown in FIGS. 11 and 12, in the photosensor circuits 9b and 9c, the source of the amplifier element 7 is connected to the intersection A of the photosensor element 6 and the capacitor element 8. This allows for accurate control when the sensitivity of the photosensor element 6 is at a sufficient level.

In the present embodiment, the configuration where a touch position is detected by utilizing the difference in reflected light intensity, which is made by the light from the backlight 45 being reflected by the finger F on the surface of the polarizing plate 42 of the liquid crystal display device 50, was described, however, it can also be configured such that a shadow of the finger made by light from the front surface side is detected, or a light-emitting part of a touch pen or the like, which emits light from the tip thereof, is detected.

In the present embodiment, the TFT substrate 20 in which an electrode of the switching element 5 that is connected to the pixel electrode 19 is used as the drain electrode was described as an example. The present invention, however, can also be applied to a TFT substrate in which an electrode of the switching element that is connected to the pixel electrode is referred to as the source electrode.

In the respective embodiments above, examples where the TFTs were used as the photosensor elements were described, but the present invention can also be applied to TFDs (Thin Film Diodes) and the like.

INDUSTRIAL APPLICABILITY

As described above, in the present invention, the sensitivity of the photosensor elements can be improved and the size of the elements can be reduced. Therefore, the present invention is useful for a TFT substrate with built-in photosensor elements, and a display device using the TFT substrate.

DESCRIPTION OF REFERENCE CHARACTERS

C channel region
P pixel
Ra resist pattern, first resist pattern
Rb second resist pattern
5 switching element
6, 6a, 6aa, 6b, 6c photosensor element
7 amplifier element
9, 9a, 9b, 9c photosensor circuit
10 insulating substrate
11aa switching gate electrode
11da gate electrode
11e amplifier gate electrode
12 gate insulating film
13 intrinsic amorphous silicon film, microcrystalline silicon film (intrinsic semiconductor film)
13a microcrystalline silicon layer (switching intrinsic semiconductor layer)
13db intrinsic amorphous silicon layer, microcrystalline silicon layer (intrinsic semiconductor layer)
13e microcrystalline silicon layer (amplifier intrinsic semiconductor layer)
14 N⁺ amorphous silicon film (extrinsic semiconductor film)
14a N⁺ amorphous silicon layer (switching extrinsic semiconductor layer)
14db N⁺ amorphous silicon layer (extrinsic semiconductor layer)
14e N⁺ amorphous silicon layer (amplifier extrinsic semiconductor layer)
15a switching semiconductor layer
15da semiconductor structure layer
15db semiconductor layer
15e amplifier semiconductor layer
16 metal film
16aa switching source electrode
16da, 16dc source electrode
16ab switching drain electrode
16db drain electrode
16ba amplifier source electrode
16ca amplifier drain electrode
18a, 18b conductive film
20 TFT substrate
21, 29 light-shielding layer

The invention claimed is:

1. A photosensor circuit, comprising:
a photosensor element; and
an amplifier element connected to the photosensor element,
wherein the photosensor element comprises:
a gate electrode disposed on an insulating substrate;
a gate insulating film disposed so as to cover the gate electrode;
a semiconductor layer provided on the gate insulating film so as to overlap the gate electrode; and
a source electrode and a drain electrode provided on the semiconductor layer so as to overlap the gate electrode and so as to face each other,
wherein the semiconductor layer has an intrinsic semiconductor layer in which the channel region is defined and an extrinsic semiconductor layer that is laminated on said intrinsic semiconductor layer such that said channel region is exposed,
wherein the extrinsic semiconductor layer protrudes from the drain electrode on a side close to the channel region,
wherein the amplifier element comprises:
an amplifier gate electrode provided on the insulating substrate;
the gate insulating film arranged to cover the amplifier gate electrode;
an amplifier semiconductor layer disposed on the gate insulating film so as to overlap the amplifier gate electrode; and
an amplifier source electrode and an amplifier drain electrode provided on the amplifier semiconductor layer so as to overlap the amplifier gate electrode and so as to face each other,
wherein the amplifier semiconductor layer has an amplifier intrinsic semiconductor layer in which a channel region is defined and an amplifier extrinsic semiconductor layer that is laminated on said intrinsic semiconductor layer such that said channel region is exposed, and
wherein edges of the amplifier extrinsic semiconductor layer on respective sides close to the channel region are respectively aligned with an edge of the amplifier source electrode and an edge of the amplifier drain electrode on the respective sides close to the channel region.

2. A thin-film transistor substrate, comprising:
a plurality of pixels arranged in a matrix;
a plurality of switching elements respectively provided in the pixels; and
a plurality of photosensor elements respectively provided in the pixels,
wherein each of the photosensor elements comprises:
a gate electrode disposed on an insulating substrate;
a gate insulating film disposed so as to cover the gate electrode;
a semiconductor layer disposed on the gate insulating film so as to overlap the gate electrode; and
a source electrode and a drain electrode provided on the semiconductor layer so as to overlap the gate electrode and so as to face each other,
wherein the semiconductor layer has an intrinsic semiconductor layer in which a channel region is defined and an extrinsic semiconductor layer that is laminated on said intrinsic semiconductor layer such that said channel region is exposed,
wherein the extrinsic semiconductor layer protrudes from the drain electrode on a side close to the channel region,
wherein each of the switching elements comprises:
a switching gate electrode provided on the insulating substrate;
the gate insulating film disposed so as to cover the gate electrode;
a switching semiconductor layer disposed on the gate insulating film so as to overlap the switching gate electrode; and
a switching source electrode and a switching drain electrode provided on the switching semiconductor layer so as to overlap the switching gate electrode and so as to face each other,
wherein the switching semiconductor layer has a switching intrinsic semiconductor layer in which a channel region is defined and a switching extrinsic semiconductor layer that is laminated on said intrinsic semiconductor layer such that said channel region is exposed,
wherein an edge of the switching extrinsic semiconductor layer on a side close to the channel region is aligned with an edge of the drain electrode on the side close to the channel region, and
wherein a light-shielding layer is disposed so as to cover the respective switching element.

3. The thin-film transistor substrate according to claim 2, comprising a plurality of amplifier elements respectively provided in the respective pixels,
wherein each of the amplifier elements comprises:
an amplifier gate electrode provided on the insulating substrate;
the gate insulating film disposed so as to cover the amplifier gate electrode;
an amplifier semiconductor layer disposed on the gate insulating film so as to overlap the amplifier gate electrode; and
an amplifier source electrode and an amplifier drain electrode provided on the amplifier semiconductor layer so as to overlap the amplifier gate electrode and so as to face each other,
wherein the amplifier semiconductor layer has an amplifier intrinsic semiconductor layer in which the channel region is defined and an amplifier extrinsic semiconductor layer that is laminated on said intrinsic semiconductor layer such that said channel region is exposed,
wherein edges of the amplifier extrinsic semiconductor layer on respective sides close to the channel region are aligned with an edge of the amplifier source electrode and an edge of the amplifier drain electrode on the respective sides close to the channel region, and
wherein a light-shielding layer is disposed so as to cover the respective amplifier element.

4. A display panel, comprising:
the thin-film transistor substrate according to claim 2;
an opposite substrate disposed so as to face the thin-film transistor substrate; and
a display medium layer disposed between the thin-film transistor substrate and the opposite substrate.

5. A method of manufacturing a photosensor element, comprising:
a first step of forming a gate electrode on an insulating substrate;
a second step of forming a gate insulating film to cover the gate electrode;
a third step of forming a semiconductor structure layer by depositing an intrinsic semiconductor film and an extrinsic semiconductor film in this order so as to cover the gate insulating film and by patterning said intrinsic semiconductor film and said extrinsic semiconductor film so as to overlap the gate electrode; and a fourth step of forming a semiconductor layer having an intrinsic semiconductor layer in which a channel region is defined and an extrinsic semiconductor layer that is laminated on said intrinsic semiconductor layer such that said channel region is exposed, a drain electrode that overlaps the gate electrode and that allows the extrinsic semiconductor layer to protrude therefrom on a side close to the channel region, and a source electrode that overlaps the gate electrode and that faces said drain electrode by forming a metal film so as to cover the semiconductor structure layer and by patterning said metal film and the semiconductor structure layer, wherein, in the fourth step, the source electrode and the drain electrode are formed by forming, on the metal film, a resist pattern having an opening that corresponds to the channel region, by etching the metal film and the semiconductor structure layer by anisotropic etching using said resist pattern so as to form the intrinsic semiconductor layer and the extrinsic semiconductor layer, and by thereafter etching the metal film by isotropic etching using the resist pattern.

6. A method of manufacturing a photosensor element, comprising:

a first step of forming a gate electrode on an insulating substrate;

a second step of forming a gate insulating film to cover the gate electrode;

a third step of forming a semiconductor structure layer by depositing an intrinsic semiconductor film and an extrinsic semiconductor film in this order so as to cover the gate insulating film and by patterning said intrinsic semiconductor film and said extrinsic semiconductor film so as to overlap the gate electrode; and a fourth step of forming a semiconductor layer having an intrinsic semiconductor layer in which a channel region is defined and an extrinsic semiconductor layer that is laminated on said intrinsic semiconductor layer such that said channel region is exposed, a drain electrode that overlaps the gate electrode and that allows the extrinsic semiconductor layer to protrude therefrom on a side close to the channel region, and a source electrode that overlaps the gate electrode and that faces said drain electrode by forming a metal film so as to cover the semiconductor structure layer and by patterning said metal film and the semiconductor structure layer, wherein the fourth step includes forming, on the metal film, a first resist pattern having an opening that corresponds to the channel region, etching the metal film and the semiconductor structure layer by anisotropic etching using said first resist pattern so as to form the intrinsic semiconductor layer and the extrinsic semiconductor layer, removing the first resist pattern, forming a second resist pattern that is used for forming at least the drain electrode, and etching the metal film by anisotropic etching using said second resist pattern.

* * * * *